United States Patent
Liu et al.

(10) Patent No.: US 10,380,281 B2
(45) Date of Patent: Aug. 13, 2019

(54) VECTOR-RATIO SAFETY FACTORS FOR WELLBORE TUBULAR DESIGN

(71) Applicant: Landmark Graphics Corporation, Houston, TX (US)

(72) Inventors: Zhengchun Liu, Sugar Land, TX (US); Robello Samuel, Cypress, TX (US); Adolfo Gonzales, Houston, TX (US); Yongfeng Kang, Katy, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 295 days.

(21) Appl. No.: 15/359,397

(22) Filed: Nov. 22, 2016

(65) Prior Publication Data

US 2018/0142536 A1    May 24, 2018

(51) Int. Cl.
G06F 17/50 (2006.01)
E21C 41/00 (2006.01)
E21B 47/06 (2012.01)

(52) U.S. Cl.
CPC .......... *G06F 17/5009* (2013.01); *E21C 41/00* (2013.01); *E21B 47/06* (2013.01)

(58) Field of Classification Search
CPC ............................... G06F 17/00; E21B 47/06
USPC ......................................................... 703/10
See application file for complete search history.

(56) References Cited

U.S. PATENT DOCUMENTS

| 2,256,455 A | 9/1941 | Crawford |
|---|---|---|
| 7,048,062 B2 | 5/2006 | Ring et al. |
| 8,099,266 B2 | 1/2012 | Burge et al. |
| 2002/0049575 A1 | 4/2002 | Jalali et al. |
| 2007/0063513 A1 | 3/2007 | Boyd |
| 2013/0124165 A1 | 5/2013 | Rubin et al. |
| 2014/0214326 A1* | 7/2014 | Samuel ........... E21B 47/00 702/11 |

(Continued)

FOREIGN PATENT DOCUMENTS

WO    WO-2015047406 A1 *    4/2015 ............. E21B 43/10

OTHER PUBLICATIONS

PetroWiki, "Strength of casing and tubing", Jun. 2016, SPE International, PetroWiki (Year: 2016).*

(Continued)

*Primary Examiner* — Andre Pierre Louis
*Assistant Examiner* — Faraj Ayoub

(57) ABSTRACT

Systems and methods for determining vector-ratio safety factors for wellbore tubular design are provided. Pressure and temperature data for at least one load point along a tubular component of a wellbore are obtained. An effective failure axial load expected at the load point is calculated during a downhole operation to be performed along one or more sections of the wellbore within a subsurface formation, based on the obtained data. An upper boundary and a lower boundary for the effective failure axial load are determined, based on physical properties of the tubular component at the load point. A midpoint of the effective failure axial load is calculated based on the upper and lower boundaries. A critical failure differential pressure is calculated, based on the midpoint of the effective failure axial load. A vector-ratio safety factor is calculated, based on the critical failure differential pressure relative to the effective failure axial load.

17 Claims, 10 Drawing Sheets

(56) References Cited

U.S. PATENT DOCUMENTS

2015/0012253 A1 1/2015 O'Donnell et al.
2016/0203239 A1 7/2016 Samuel et al.

OTHER PUBLICATIONS

NT CADCAM, "Simulation of a Stress Analysis with Flow Results", Oct. 2016, SolidWorks Tech Blog, 3DS (Year: 2016).*
Liu et al, "The Radial Approach to Safety Factors for Tubular Design", SPE Annual Technical Conference and Exhibition, Sep. 2016 (Year: 2016).*
Gatekeeper, "Collapse Strength of Casing Subjected to Combined Load", Mar. 2016, Gatekeeper, Materials & Corrosion, GateINC (Year: 2016).*
Korean Intellectual Property Office, PCT International Application PCT/US2017/052091 Search Report and Written Opinion, dated Dec. 11, 2017, 15 pages, Korea.
Zhengchun Liu, Frans Klever, Robello Samuel, Adolfo Gonzales and Yongfeng Kang, The Radial Approach to Safety Factors for Tubular Design, Sep. 26-28, 2016, 21 pages, SPE181459-MS, Society of Petroleum Engineers, SPE Annual Technical Conference and Exhibition, Dubai.

* cited by examiner

VECTOR-RATIO SAFETY FACTORS FOR WELLBORE TUBULAR DESIGN

TECHNICAL FIELD

The present description relates to the field of hydrocarbon recovery from subsurface reservoir formations, and particularly, to wellbore tubular design for hydrocarbon recovery operations performed via wellbores drilled within subsurface reservoir formations.

BACKGROUND

During hydrocarbon recovery operations, tubular components of a wellbore, e.g., casing or tubing strings disposed within the wellbore, serve as conduits through which hydrocarbons, such as oil and gas, are produced from a subsurface formation to processing facilities at the surface. Therefore, such tubular components must be sufficiently strong to withstand the pressures and stresses associated with fluid flow between the formation and wellbore surface during drilling, production and stimulation operations. In wellbore tubular design, there is generally a tradeoff between costs and the physical size or thickness of the component. While wellbore tubular components that are too thin may be insufficient to withstand the pressures and loads expected for the wellbore, the additional costs associated with tubular components that are too thick may outweigh any increase in strength or durability that the extra thickness may provide.

A critical design parameter for wellbore tubular components is the "safety factor". Traditionally, the safety factor is defined as a ratio of the tubular component's resistance to its load. The safety factor for a wellbore tubular design therefore provides a measure of the reliability of the particular design. However, safety factors determined using such conventional techniques may not be representative of actual load conditions that can occur during a hydrocarbon recovery operation. Accordingly, wellbore tubular designs based on such conventional safety factors may be inadequate for the actual loads that can be expected during the hydrocarbon recovery operation.

BRIEF DESCRIPTION OF THE DRAWINGS

The present disclosure is best understood from the following detailed description when read with the accompanying figures.

DETAILED DESCRIPTION

Figure 1:
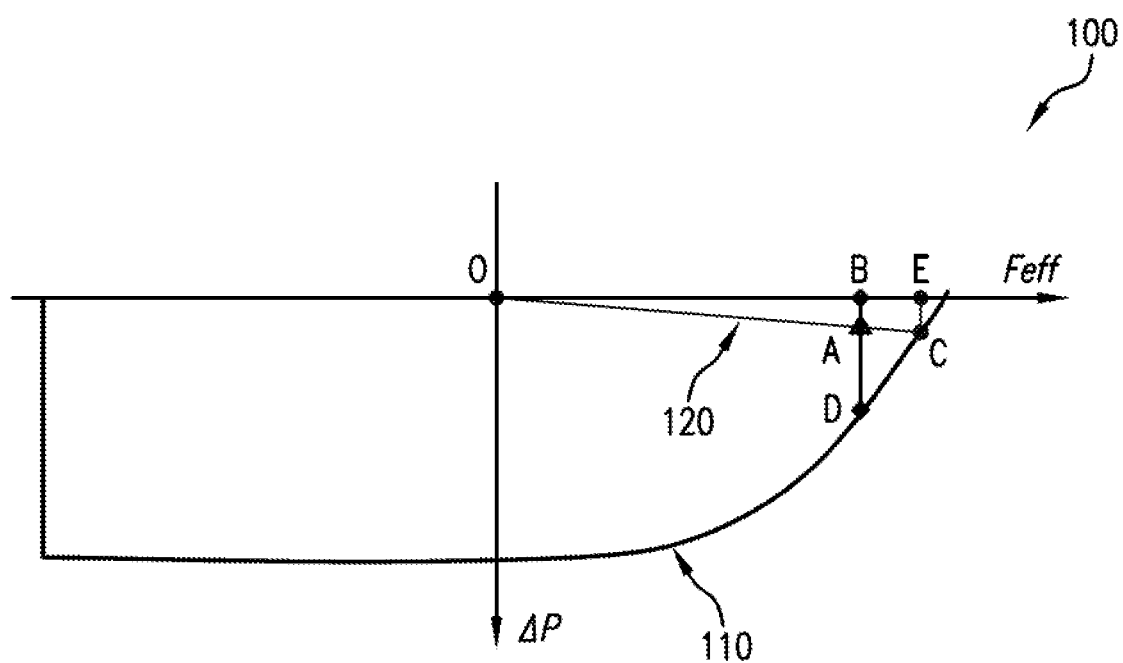
FIG. 1 is a plot graph of effective failure axial load relative to differential pressure at a load point along a tubular component (pipe body) of a wellbore.

Embodiments of the present disclosure relate to wellbore tubular design based on vector-ratio safety factors. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility. Further, when a particular feature, structure, or characteristic is described in connection with an embodiment, it is submitted that it is within the knowledge of one skilled in the relevant art to implement such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

In the detailed description herein, references to "one or more embodiments," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

The terms "tubular component" and "wellbore tubular" may be used interchangeably herein to refer broadly and inclusively to any tubular element or structural component of a wellbore. For example, such a tubular component may be a segment of pipe (or pipe body) used for transporting fluids, e.g., oil or gas, between a subsurface reservoir formation and the surface of the wellbore during hydrocarbon recovery operations. Alternatively, the tubular component may be a connector, e.g., a coupling, joint or valve assembly, between different pipe segments. A pipe segment may correspond to, for example, a portion of a casing string or a tubing string located along one or more sections of the wellbore. It should be appreciated that such tubular components may be disposed within the wellbore itself, e.g., production casing within a downhole section of the wellbore, or located at the surface of the wellbore, e.g., surface casing. Thus, while embodiments of the present disclosure may be described in the context of hydrocarbon recovery operations performed downhole, it should be appreciated that the vector-ratio techniques for wellbore tubular design as disclosed herein are not intended to be limited to only downhole tubular components and that these techniques may be applied to the design of both downhole and surface tubular components of the wellbore.

As will be described in further detail below, embodiments of the present disclosure may be used to determine vector-ratio safety factors for the design and implementation of wellbore tubular components for hydrocarbon recovery operations. Such operations may include, for example, drilling, production, workover, and/or stimulation operations performed at a wellsite for recovering hydrocarbon deposits from a subsurface reservoir formation. In one or more embodiments, the design of a tubular component may involve formulating a set of load scenarios expected for the particular component during such a wellsite operation and checking whether or not the load scenarios are within a minimum allowable safety margin (or "collapse envelope") based on the component's load capacity and resistance to collapse. Each load scenario may represent a combination of various design parameters for a particular type of load. Examples of such design parameters include, but are not limited to, material properties, load conditions, and physical dimensions of the tubular component. Load conditions may include, but are not limited to, internal and external pressures, axial and/or torsional forces, torque, and bending moment as a function of depth. Examples of different types of loads that may be considered for a particular design of the tubular component include, but are not limited to, axial load, burst load, collapse load, and triaxial load.

In one or more embodiments, a safety factor may be determined for the tubular component (or particular design thereof) with respect to each type of load and load scenario under consideration. For discussion purposes, embodiments of the present disclosure will be described in the context of collapse load. However, it should be appreciated that embodiments are not intended to be limited thereto and that the disclosed embodiments may be applied to other types of loads and load scenarios. The safety factor may be defined as a ratio of a tubular component's collapse resistance (or its structural load capacity) to collapse load (or actual load expected for the component during wellsite operations). Structural failure occurs when the collapse load exceeds the collapse resistance, e.g., when the safety factor is less than a value of one. Thus, the safety factor may indicate the component's available margin of safety or structural capacity to withstand loads at a given load point relative to its collapse envelope.

Safety factors for load points along the tubular component are typically based on calculations that rely solely on industry standard formulas, e.g., formulas published as part of the American Petroleum Institute (API) 5C3 or International Organization for Standardization (ISO) 10400 standards. Such conventional formula-based techniques generally assume that axial loads remain constant for load points along the tubular component. By contrast, the vector-ratio techniques disclosed herein allow varying loads along the tubular component to be taken into account when determining the safety factor. Accordingly, the vector-ratio safety factors determined using the disclosed techniques may provide a more accurate or realistic representation of the actual load scenarios that may be expected during a hydrocarbon recovery operation.

As used herein, the term "vector-ratio safety factor" may refer to a multiplier used to scale a load point vector such that it reaches the collapse or strength envelope of the tubular component in stress space. The stress space may be, for example, a two-dimensional (2D) or three-dimensional (3D) coordinate vector space representing stress levels in the tubular component.

Illustrative embodiments and related methodologies of the present disclosure are described below in reference to FIGS. 1-10 as they might be employed, for example, in a computer system for the design and implementation of wellbore tubular components as part of an overall well plan for a hydrocarbon recovery operation to be performed along different sections of a wellbore within a subsurface formation. For example, such a computer system may be used to determine a vector-ratio safety factor for a tubular component of the wellbore during a design phase of the operation to be performed along a current section of the wellbore. The computer system may also be used to make appropriate adjustments to the vector-ratio safety factor and design of the tubular component for subsequent sections of the wellbore based on data relating to the load bearing performance of the tubular component as obtained during an implementation or operating phase of the operation along the current section of the wellbore.

Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

FIG. 1 is a plot graph 100 of effective axial load (Feff) relative to differential pressure (ΔP) at a load point A along a tubular component of a wellbore. The tubular component may be, for example, a pipe body corresponding to a segment of a tubing string or casing string disposed within the wellbore. Thus, load point A may be a collapse load point along the pipe body. In one or more embodiments, the effective axial load at load point A may be a function of axial load and internal (or external) pressure expected during a downhole operation to be performed along one or more sections of the wellbore within a subsurface formation. In some implementations, the effective axial load may be calculated based on an industry standard formula. e.g., according to the API 5C3 or ISO 10400 standards. For example, the effective axial load according to the API 5C3 standard may be expressed using Equation (1) as follows:

$$Feff = Fa + Pi \times As \qquad (1)$$

where Fa is axial load, Pi is internal pressure, and As is the tubular cross-sectional area. However, it should be appreciated that embodiments of the present disclosure are not intended to be limited to Equation (1) or any one collapse formula and that any of various techniques for calculating effective axial load may be used, as desired for a particular implementation.

In plot graph 100 of FIG. 1, load point A is shown relative to a curve representing a collapse envelope 110 for the tubular component. Collapse envelope 110 may represent a minimum allowable margin of safety that is required for a design of the tubular component to avoid failure. In one or more embodiments, collapse envelope 110 may be based on a design factor that represents the minimum allowable safety factor for the tubular component. The value of the design factor may account for uncertainties in design parameters affecting the collapse resistance and strength of the tubular component's structure. As described above, such design parameters may include, but are not limited to, material properties, load conditions, and dimensions of the particular tubular component. In one or more embodiments, the value of the design factor may be determined based on a model of the load conditions and resistance. Such a model may be generated based on historical data of the loads and resistance associated with wellbore tubular designs used in prior hydrocarbon recovery operations.

Thus, an appropriate design of the tubular component should be based on a safety factor that is larger than the design factor as represented by collapse envelope 110 in FIG. 1. For example, the design of the tubular component should have sufficient capacity to withstand load conditions (e.g., axial force, internal pressure, external pressure, etc.) expected at load point A when the expected loads are scaled by the safety factor, i.e., the scaled loads should fall within collapse envelope 110.

The value of a traditional or "non-vector-ratio" safety factor for the tubular component may be calculated as a ratio between the minimum collapse resistance ($R_{min}$) of the tubular component and the worst case load ($Q_w$) expected for the tubular component during the hydrocarbon recovery operation. For the tubular component in the example of FIG. 1, collapse resistance may be represented by the length of line segment BD as shown between points B and D in plot graph 100. The collapse load of the tubular component may be represented by the length of line segment BA between point B and the load point A. Therefore, the non-vector-ratio safety factor (SF) for the tubular component in this example may be expressed using Equation (2) as follows:

$$SF=|BD|/|BA| \qquad (2)$$

According to Equation (2), if the value of the collapse load (BA) were much smaller than the collapse resistance (BD) of the tubular component, the value of the non-vector-ratio safety factor at load point A would be relatively large (e.g., greater than 3.0). However, such a large safety factor would be impractical for the tubular component design in this example, as load point A is near collapse envelope 110 and any loads scaled by the safety factor would fall outside of collapse envelope 110. Therefore, a relatively smaller safety factor would be expected, given the smaller margin of safety between load point A and collapse envelope 110.

In one or more embodiments, a vector-ratio safety factor may be determined as an alternative to the traditional safety factor for the tubular component design. In contrast with the traditional safety factor according to Equation (2) above, the vector-ratio safety factor may account for varying loads along the wellbore tubular component. For example, line segment AD in FIG. 1 may represent a path between load point A and a point D on collapse envelope 110 for which the corresponding effective axial load along the x-axis of plot graph 100 appears to remain constant. However, under actual load conditions, the effective axial load may change along a vector-ratio path, e.g., as represented by line segment AC between load point A and a point C on collapse envelope 110. As shown in FIG. 1, point C may correspond to a cross point between collapse envelope 110 and a radial line 120 extending from an origin O of plot graph 100 through load point A.

The vector-ratio safety factor (Vector-ratio SF) for load conditions at load point A along the tubular component may be expressed using Equation (3) as follows:

$$\text{Vector-ratio } SF=|OC|/|OA|=|EC|/|BA| \qquad (3)$$

where line segment OC and EC represent the collapse resistance of the tubular component and line segment OA and BA represent the collapse load. In one or more embodiments, the collapse resistance may be calculated based on an industry standard formula. Examples of different industry standard formulas that may be used include, but are not limited to, the API 5C3 collapse formula, ISO/TR 10400: 2007 Klever-Stewart rupture formula, or ISO/TR 10400: 2007 Klever-Tamano collapse formula.

As will be described below with respect to the examples in FIGS. 4-9, the vector-ratio safety factor may become much smaller relative to the traditional safety factor in cases where the effective axial load (e.g., actual axial load plus internal pressure) is very high, which is expected since the vector-ratio collapse resistance (e.g., at the cross point C of radial line 120 and collapse envelope 110) would be much smaller in such cases. Also, when the expected loads (e.g., axial force, internal pressure, and external pressure, etc.) at load point A and other load points along the tubular component are scaled by the vector-ratio safety factor, each load point as scaled should fall directly on collapse envelope 110 without exceeding the design factor and minimum allowable margin of safety associated with the tubular component. As such, the vector-ratio safety factor according to Equation (3) may provide a more accurate or realistic representation of the margin of safety under the actual load conditions that can be expected along the tubular component. While the example in FIG. 1 is described with respect to a collapse load point along a pipe segment or pipe body, the disclosed techniques may also be used to determine vector-ratio safety factors for burst loads at connection points between different pipe segments, as will be described with respect to the example illustrated in FIG. 2.

Figure 2:
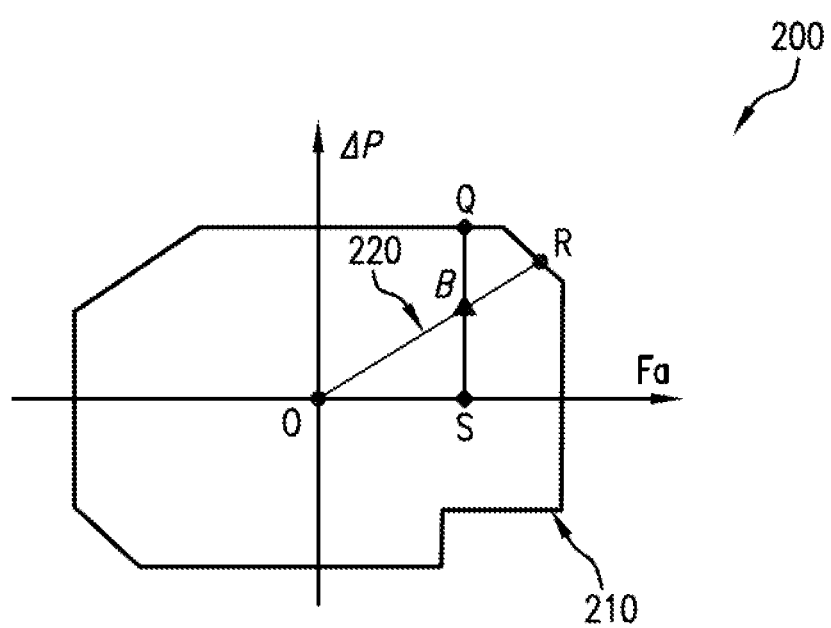
FIG. 2 is a plot graph of an illustrative axial load relative to differential pressure at a burst load point corresponding to a connection (or pipe connector) between different pipe segments of a wellbore.

FIG. 2 is a plot graph 200 of an illustrative axial load (Fa) relative to differential pressure (ΔP) for a load point B corresponding to a connection between different pipe segments of a wellbore. For example, load point B may correspond to a point on a coupling, valve or other type of connector between the different pipe segments. The different pipe segments in this example may correspond to different segments of a tubing string or a casing string disposed within the wellbore, as described above. Similar to load point A and collapse envelope 110 in plot graph 100 of FIG. 1, load point B is shown in plot graph 200 of FIG. 2 relative to a connection failure envelope 210. However, failure envelope 210 has a closed polygonal shape rather than the open curved shape of collapse envelope 110 as shown in FIG. 1. In the example as shown in FIG. 2, a radial line 220 represents a burst load at load point B inside failure envelope 210, which extends from origin O of plot graph 200 and intersects failure envelope 210 at a point R.

Therefore, the vector-ratio safety factor for the burst load point (B) of the pipe connector in this example may be expressed using Equation (4) as follows:

$$\text{Vector-ratio } SF=|OR|/|OB| \qquad (4)$$

where line segment OR may represent the burst strength or resistance of the pipe connector and line segment OB may represent the burst load.

The traditional safety factor for the pipe connector's burst load point may be expressed using Equation (5) as follows:

$$SF=|SQ|/|SB| \qquad (5)$$

where line segment SQ may represent the burst strength or resistance of the pipe connector and line segment SB may represent the burst load.

In one or more embodiments, collapse envelope 110 of FIG. 1 and failure envelope 210 of FIG. 2 may be defined by a user, e.g., via a graphical user interface (GUI) of a wellbore tubular design application executable at a computing device of the user. An example of such a computing device will be described in further detail below with respect to FIG. 10. In some implementations, the wellbore tubular design application may be part of a well planning application executable at the user's device. Such a well planning and design application may provide, for example, a GUI that enables the user to interact directly with a visualization of plot graph 100 or plot graph 200 in order to define or visually "draw" the boundaries of the collapse envelope 110 or failure envelope 210, respectively, within each plot graph by using a user input device, e.g., a mouse, keyboard, microphone, or touchscreen, coupled to the user's computing device. In one or more embodiments, the user may use GUI or other interface provided by such an application to specify data with respect to the axial loads and differential pressures for a particular load point or tubular component (e.g., segment of pipe) along the wellbore, as will be described in further detail below.

Figure 3:
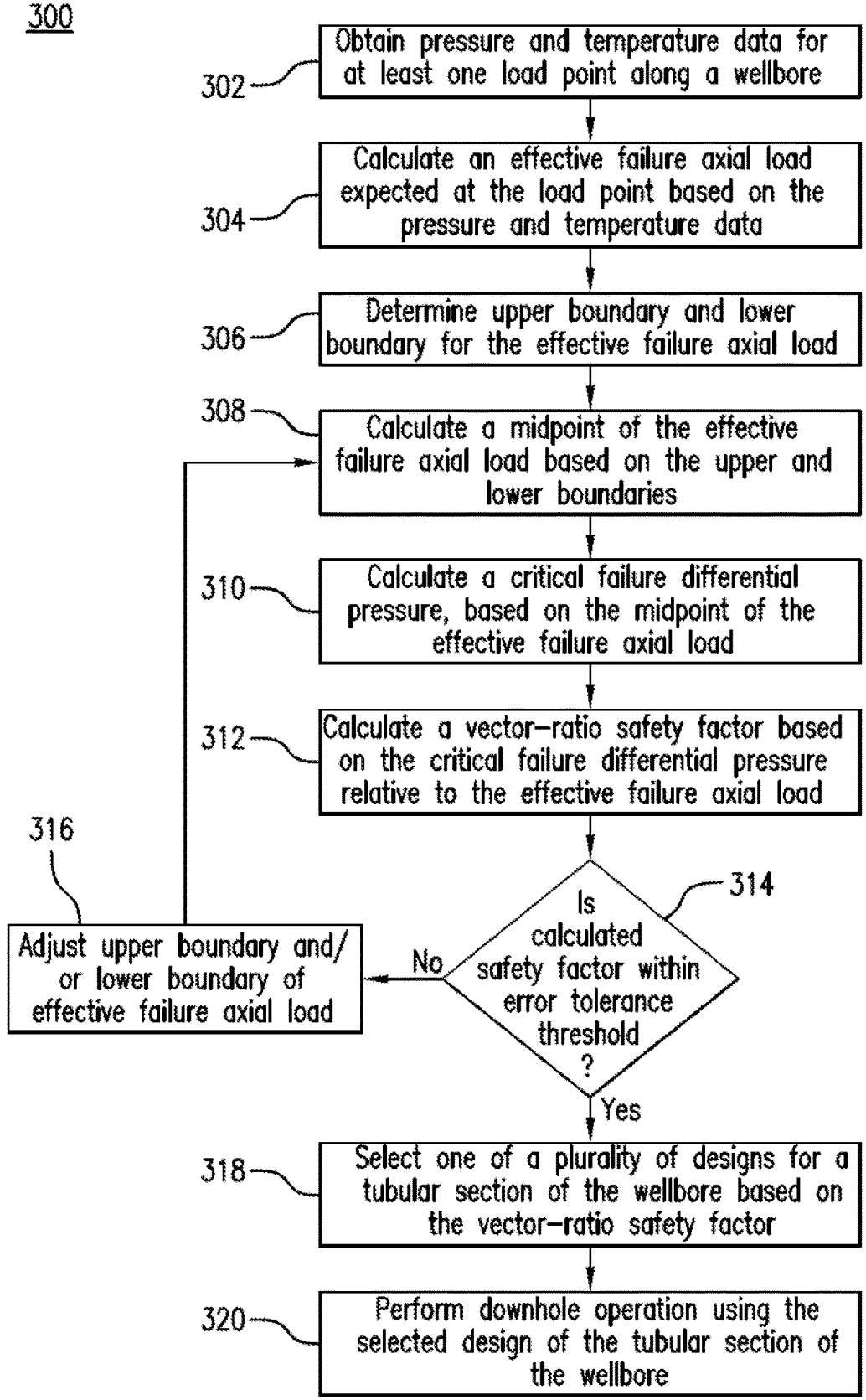
FIG. 3 is a flow diagram of an illustrative process of determining vector-ratio safety factors for wellbore tubular design.

FIG. 3 is a flow diagram of an illustrative process 300 of determining vector-ratio safety factors for wellbore tubular design. For example, process 300 may be used to determine a vector-ratio safety factor for a load point along a tubular component of a wellbore. In one or more embodiments, the tubular component may correspond to a portion of a tubing string or a casing string along one or more sections of the wellbore. The portion of the tubing/casing string may be either a segment of a pipe (or pipe body) or a pipe connector between different pipe segments, as described above. For discussion purposes, process 300 will be described with reference to the collapse load points shown in plot graph 100 of FIG. 1, as described above. However, process 300 is not intended to be limited thereto.

As shown in FIG. 3, process 300 begins in block 302, which includes obtaining pressure and temperature data for at least one load point along the tubular component of the wellbore. In one or more embodiments, the pressure and temperature data may be obtained from a thermal flow simulation for the load point along the tubular component of the wellbore. In some implementations, the pressure and temperature data may be stored as part of the simulation results within a memory or data store. For example, such data may be stored within the data store as part of a data file accessible to a well design and planning application executable at a computing device of a user, as described above. The data store may be, for example, a remote data store or cloud-based storage device coupled to the user's computing device via a communication network. The communication network may be one or any combination of networks including, for example, a local area network, a medium-area network, or a wide-area network, e.g., the Internet.

In block 304, the pressure and temperature data obtained in block 302 may be used to calculate an effective failure axial load expected at the load point during a downhole operation to be performed along one or more sections of the wellbore within a subsurface formation. In one or more embodiments, the calculation in block 304 may include estimating an axial force and a differential pressure at the load point and then, calculating the effective failure axial load based on the estimated axial force and differential pressure. The axial force and the differential pressure in this example may be estimated based on the corresponding pressure and temperature data obtained in block 302.

In block 306, an upper boundary and a lower boundary for the effective failure axial load are determined. The upper and lower boundaries of the effective failure axial load as determined in block 306 may represent an initial set of boundaries for the effective failure axial load. As will be described in further detail below, one or both of these boundaries may be adjusted (in block 316) based on error tolerance limits for the particular load scenario and design of the tubular component under consideration. In one or more embodiments, the boundaries for the effective failure axial load may be determined in block 306 based on physical properties of the tubular component at the load point. The physical properties of the tubular component at the particular load point may be indicative of its physical limits or structural load capacity for a given type of load or set of load conditions expected at the load point. In some implementations, prior experience with a particular design of the tubular component from previous downhole operations, e.g., based on historical data associated with the particular design and load conditions encountered previously, may also be considered in determining appropriate boundaries for the effective failure axial load in block 306.

Process 300 then proceeds to block 308, which includes calculating a midpoint of the effective failure axial load based on the upper and lower boundaries of the effective failure axial load, as determined in block 306 above. In one or more embodiments, the midpoint calculation in block 308 may be performed as part of an interval-halving (or bisection) technique for calculating the vector-ratio safety factor for a particular load scenario. It should be appreciated that any of various bisection techniques may be used, for example, Ridders' method or other appropriate bisection algorithm. The calculation of the midpoint of the effective failure axial load in this example may be expressed using Equation (6) as follows:

$$Feff_C = 0.5 \times (Feff_1 + Feff_2) \qquad (6)$$

where $Feff_1$ is a value corresponding to the upper boundary of the effective failure axial load and $Feff_2$ is a value corresponding to the lower boundary of the effective failure axial load.

In block 310, a critical failure differential pressure is calculated based on the midpoint of the effective failure axial load from block 308. In one or more embodiments, the critical failure differential pressure may be a critical collapse resistance along a radial load trajectory of the tubular component, e.g., as represented by radial line 120 in plot graph 100 of FIG. 1, as described above. In some implementations, the critical failure differential pressure (or collapse resistance) may be calculated based on an industry standard collapse formula, e.g., the API 5C3 collapse formula, as described above. Alternatively, the critical failure differential pressure may be calculated based on an interpolation from a plurality of user-specified data points of failure differential pressure and the effective failure axial load at the load point along the wellbore. Such data points may be specified by a user via, for example, a GUI or other type of interface provided by a well planning and design application executable at the user's computing device, as described above.

In block 312, a vector-ratio safety factor is calculated based on the critical failure differential pressure relative to the effective failure axial load. For example, the vector-ratio safety factor for load point A of the tubular component in FIG. 1 may be calculated using Equation (7) as follows:

$$\text{Vector-ratio } SF = OC/OA = \sqrt{\frac{Feff_C^2 + dP_C^2}{Feff_A^2 + dP_A^2}} \qquad (7)$$

where: OC is the collapse resistance and OA is the collapse load, as shown by line segments OC and OA, respectively, in plot graph 100 of FIG. 1, as described above; $\text{Feff}_C$ is the midpoint of the effective failure axial load (according to Equation (6) above); $dP_C$ is the critical failure differential pressure at cross point C of radial line 120 with collapse envelope 110, as shown in FIG. 1; $\text{Feff}_A$ is the effective failure axial load at load point A; and $dP_A$ is the differential pressure at load point A. The critical failure differential pressure $dP_C$ at point C in this example may represent a collapse resistance of the tubular component.

Process 300 then proceeds to block 314, which includes determining whether or not the vector-ratio safety factor calculated in block 312 is within an error tolerance threshold. The value(s) for the error tolerance may be specified by a user, e.g., based on user-specified design criteria for the tubular component, or predetermined based on historical data relating to the performance of the particular design or similar designs under load conditions encountered during previous downhole operations.

In one or more embodiments, the error tolerance may be based on an error function defined for the vector-ratio safety factor based on the critical failure differential pressure calculated in block 310. For example, according to Equation (7) above, the critical failure differential pressure ($dP_C$) at point C on collapse envelope 110 for the tubular component in FIG. 1 must satisfy radial line Equation (8) as follows:

$$dP_C = \text{Feff}_C \cdot dP_A / \text{Feff}_A \quad (8)$$

Using Equation (8) above, the error function for the vector-ratio safety factor based on the critical failure differential pressure and effective failure axial load may be defined according to Equation (9) as follows:

$$f(\text{Feff}_C) = dP_C(\text{Feff}_C) - \text{Feff}_C * dP_A / \text{Feff}_A \quad (9)$$

Alternatively, the error function for the vector-ratio safety factor may be defined based on the critical failure differential pressure, the traditional safety factor (SF), the axial load, and internal pressure, e.g., according to Equation (10) as follows:

$$f(SF) = dP_C(SF, Fa, Pi) - \text{Feff}_C(SF, Fa, Pi) \times (dP_A / \text{Feff}_A) \quad (10)$$

If it is determined in block 314 that the vector-ratio safety factor is not within the error tolerance threshold, process 300 proceeds to block 316, in which the upper boundary and/or lower boundary of the effective failure axial load is adjusted. In one or more embodiments, the adjustment performed in block 316 may involve replacing either the upper boundary or the lower boundary (e.g., $\text{Feff}_1$ or $\text{Feff}_2$ in Equation (6) above) with the midpoint ($\text{Feff}_C$) of the effective failure axial load. The operations in blocks 308, 310, 312, 314 and, if necessary, 316 are then repeated over one or more iterations with new or adjusted effective failure axial load boundaries until a new vector-ratio safety factor that is within the error tolerance threshold has been calculated. In some implementations, the number of iterations may be limited to some maximum number as desired for a particular implementation.

Process 300 then returns to block 308, where the midpoint of the effective failure axial load is recalculated based on the adjustments to the upper and/or lower boundaries of the effective failure axial load in block 316. The operations in blocks 310, 312, 314 and, if necessary, block 316 may then be repeated until a new vector-ratio safety factor that is within the error tolerance threshold has been calculated.

If or when it is determined in block 314 that the vector-ratio safety factor is within the error tolerance threshold, process 300 proceeds to block 318. Block 318 includes selecting one of a plurality of designs for the tubular component of the wellbore based on the vector-ratio safety factor. In block 320, the downhole operation is performed along one or more sections of the wellbore using the design of the tubular component selected in block 318.

Figure 7:
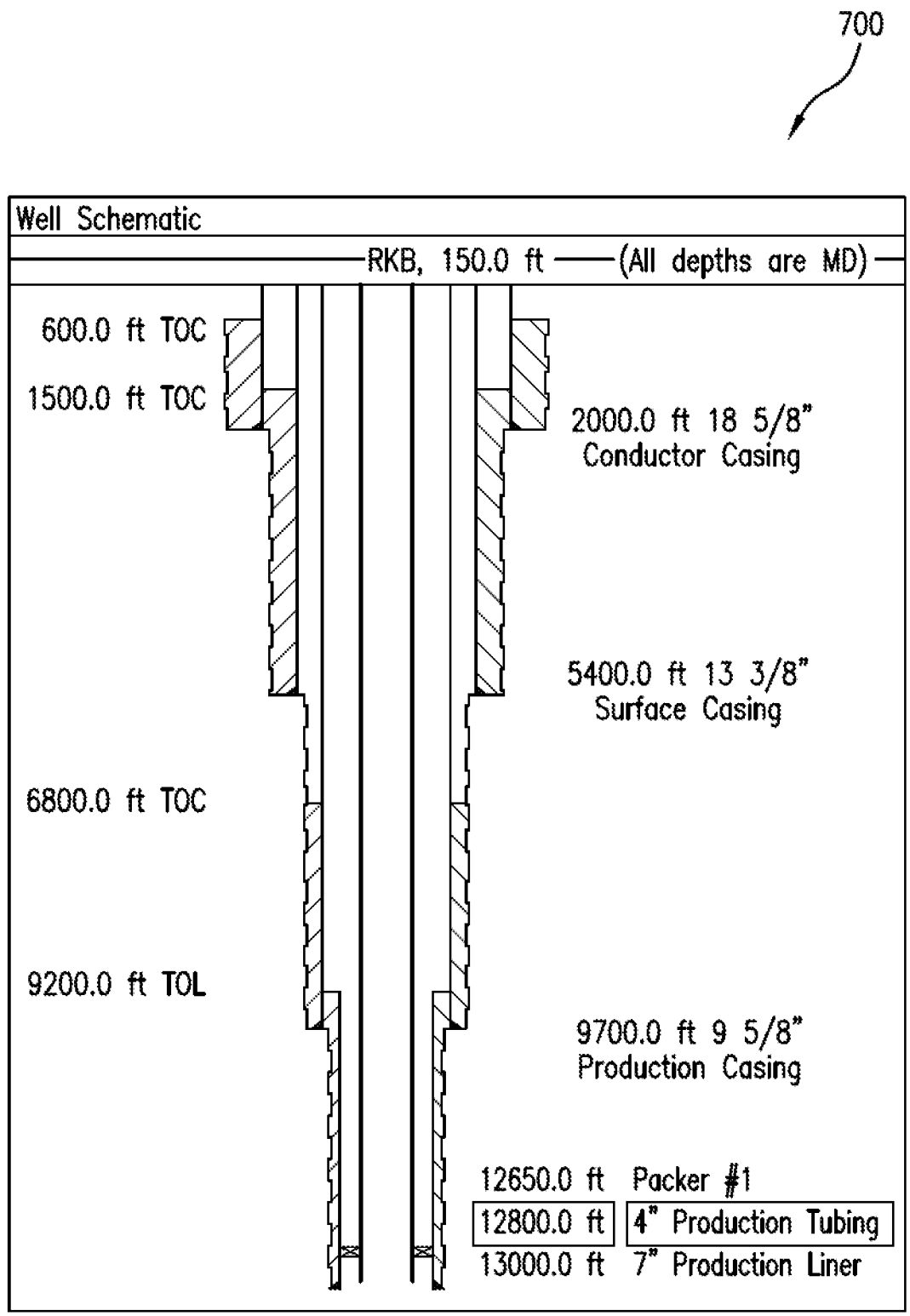
FIG. 7 is a schematic of another illustrative wellbore configuration including production tubing disposed within the wellbore.
Figure 8:
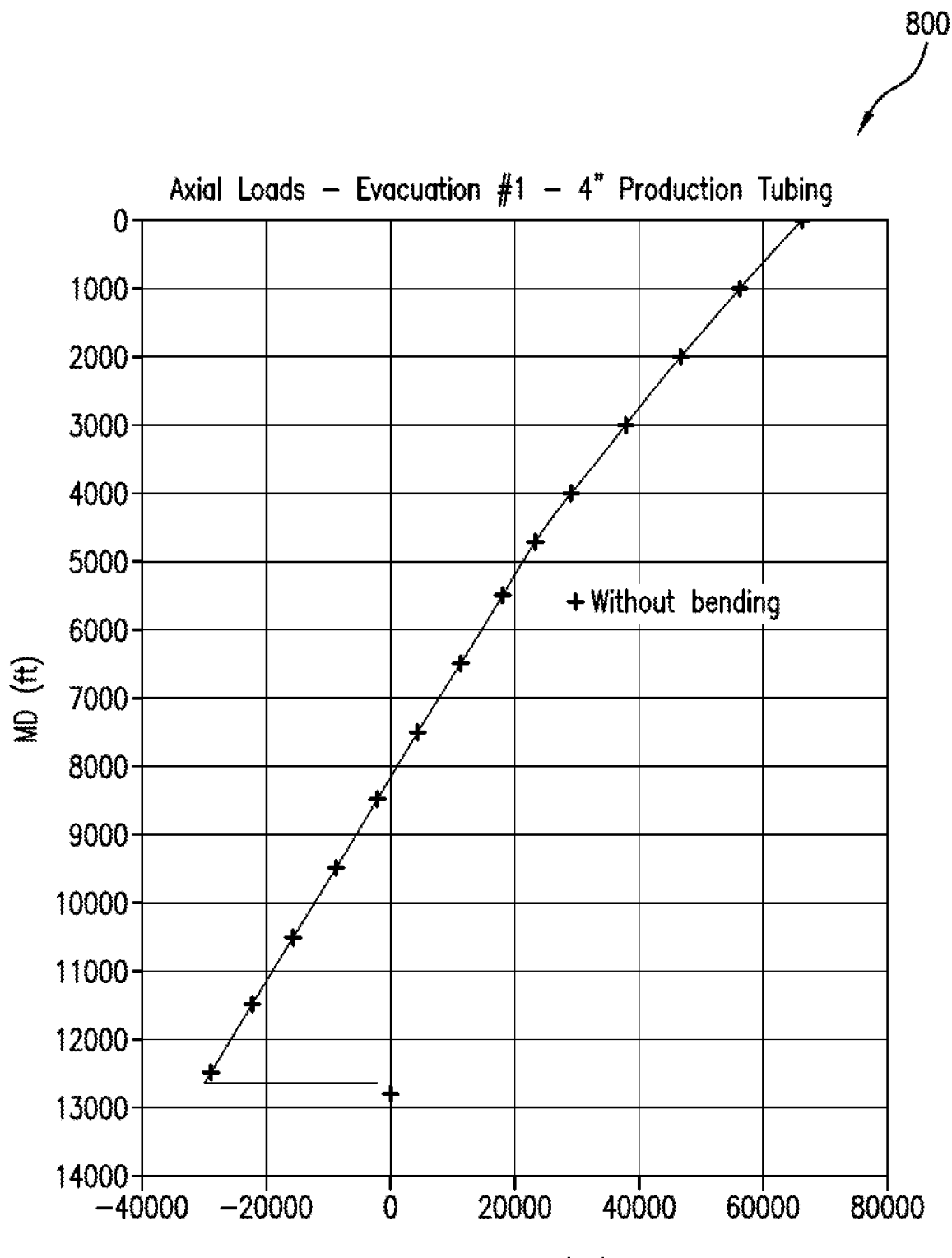
FIG. 8 is a plot graph of axial load profile for the production tubing of the wellbore configuration shown in FIG. 7.
Figure 9:
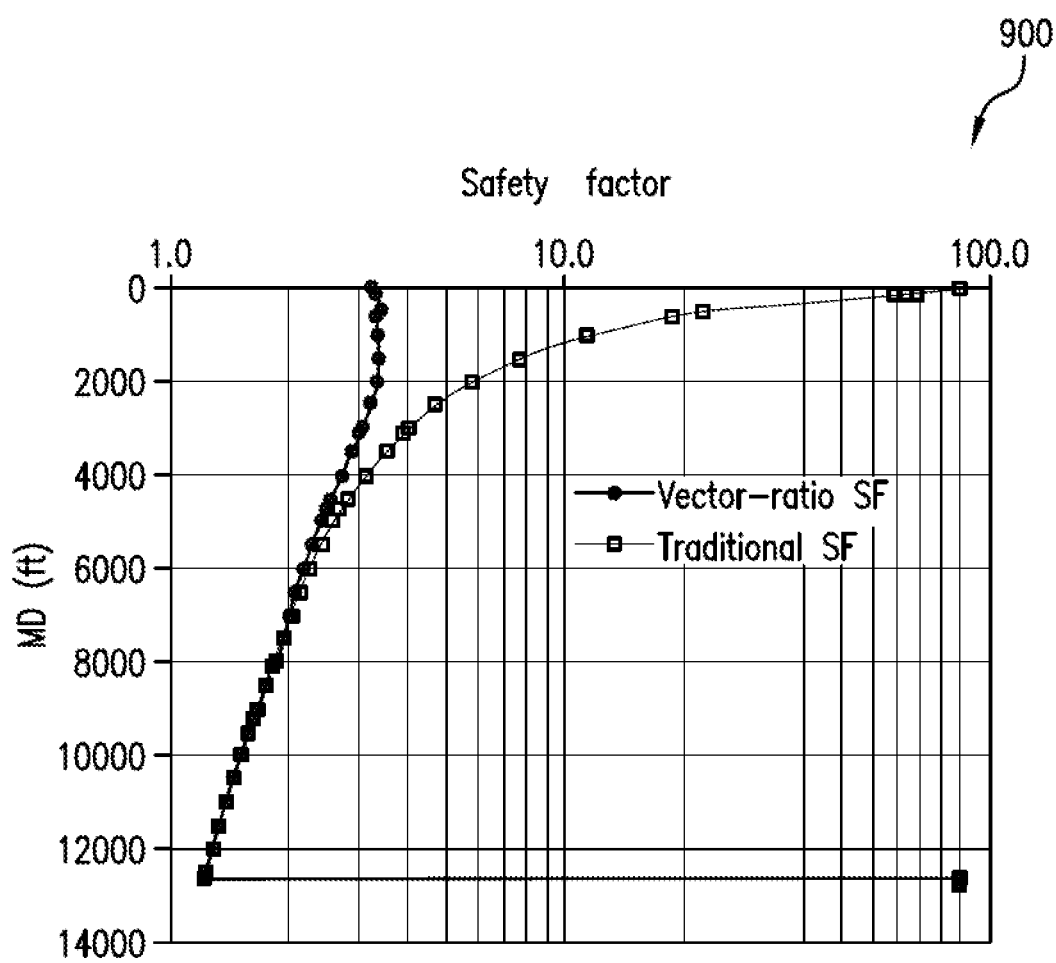
FIG. 9 is plot graph showing a comparison between a vector-ratio safety factor and a conventional safety factor for the production tubing of FIG. 7.

Additional features and characteristics of the vector-ratio techniques disclosed herein will now be described in reference to the examples illustrated in FIGS. 4-9. In particular, FIGS. 4-6 will be used to describe a comparison between traditional (or non-vector-ratio) and vector-ratio safety factor values determined for production casing at varying depths in a vertical well under collapse load conditions. FIGS. 7-9 will be used to describe a comparison between traditional and vector-ratio safety factor values determined for production tubing at varying depths in a deviated offshore well under collapse load conditions. However, it should be appreciated that the disclosed techniques are not intended to be limited to the particular wellbore configurations and tubular component designs that will be described in the following examples. While various assumptions will be made with respect to the wellbore configurations and designs in these examples, it should also be appreciated that such assumptions are made for purposes of discussion and explanation only and that these techniques may be applied to any of various types of wellbore configurations and tubular component designs. Further, while the examples in FIGS. 4-9 are described in the context of collapse load scenarios, it should be appreciated that these techniques may be applied to other types of loads, as described above.

Figure 4:
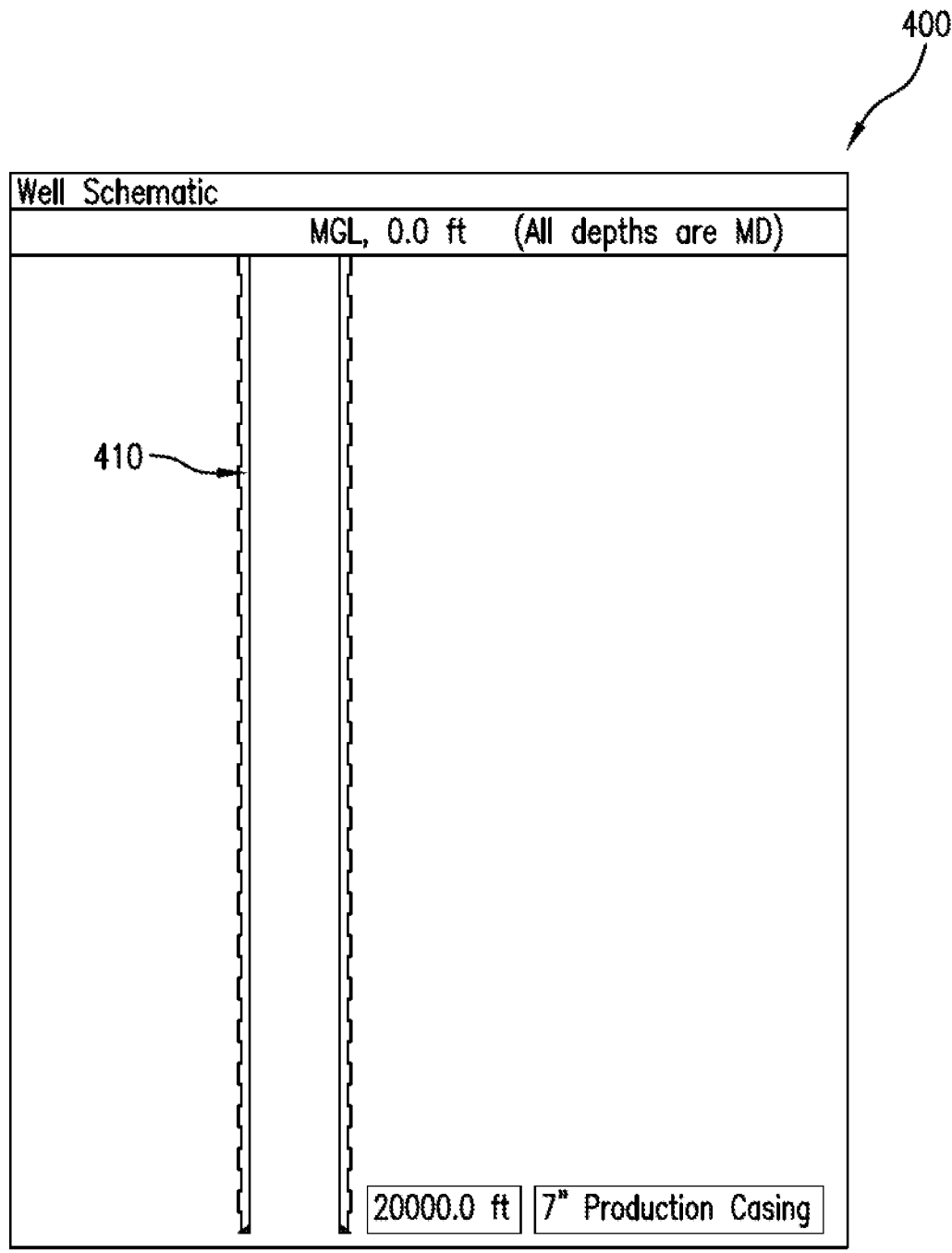
FIG. 4 is a schematic of an illustrative wellbore configuration including production casing disposed within the wellbore.
Figure 5:
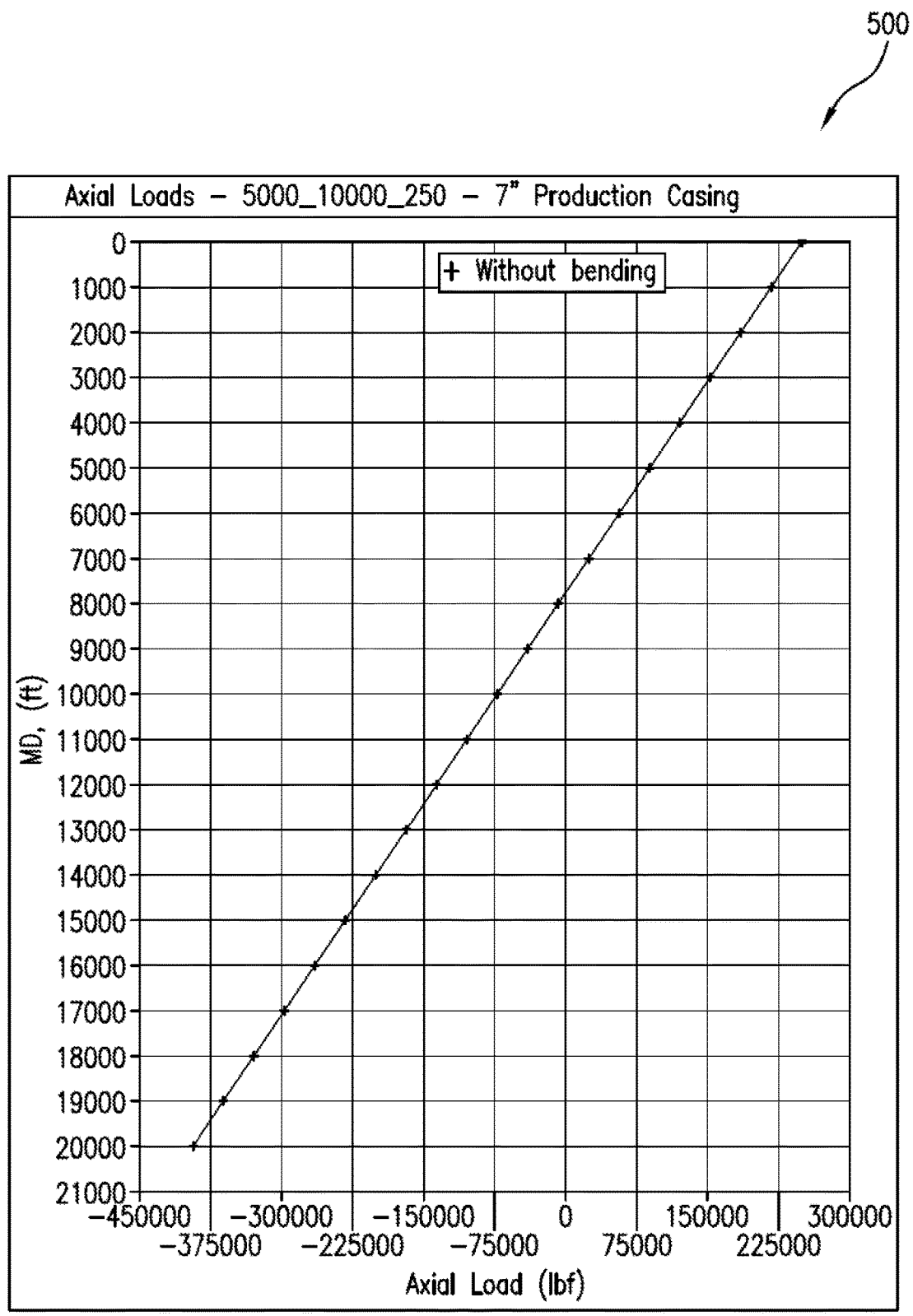
FIG. 5 is a plot graph of an illustrative axial load profile for the production casing of the wellbore configuration shown in FIG. 4.
Figure 6:
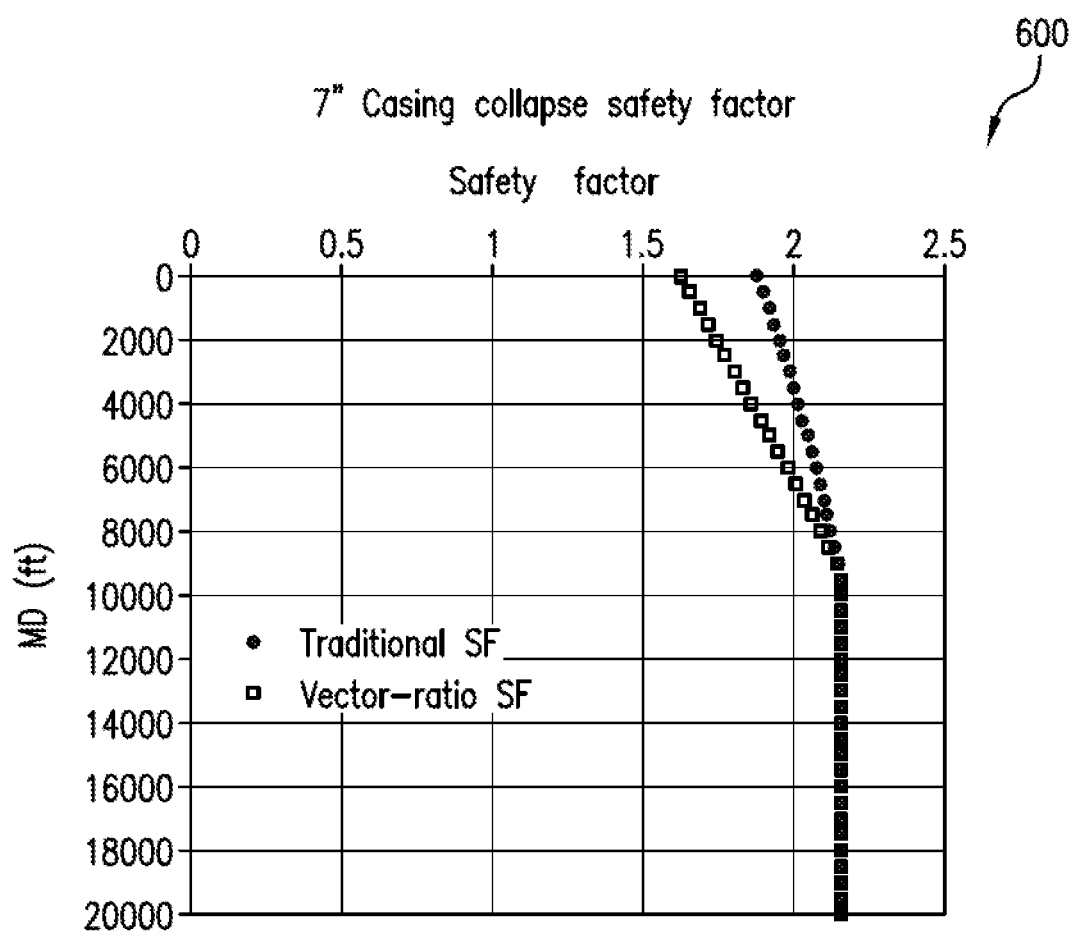
FIG. 6 is a plot graph showing a comparison between a vector-ratio safety factor and a conventional safety factor for the production casing of FIG. 4.

FIGS. 4-6 will be described in the context of an artificial vertical wellbore for performing onshore hydrocarbon production operations. FIG. 4 is a schematic of an illustrative configuration for such a vertical wellbore within a subsurface reservoir formation. In FIG. 4, a wellbore 400 is shown with a production casing 410 disposed along the length of wellbore 400 within the formation. For purposes of this example, it is assumed that the diameter of wellbore 400 is 8.5 inches and that the diameter of production casing 410 inside wellbore 400 is 7 inches. It is also assumed that the pipe body of production casing 410 weighs 32 pounds per foot and is composed of casing steel with a grade of P-110. Fluid in the annulus between the exterior of production casing 410 and wellbore 400 is assumed to be fresh water. All temperatures are assumed to be from a geothermal temperature profile, e.g., in which the temperatures may range from 80° F. at the surface to 380° F. near the bottom of wellbore 400 within the formation. Further, the internal and external pressures are assumed to be within a range of 5000 psi at the surface or top of wellbore 400 to 10,000 psi at the bottom.

FIG. 5 is a plot graph 500 of an illustrative axial load profile for production casing 410 of wellbore 400 according to the configuration shown in FIG. 4 and described above.

FIG. 6 is plot graph 600 showing a comparison between a vector-ratio safety factor and a conventional safety factor for the 7-inch production casing of wellbore 400 of FIG. 4. Table 1 below includes a listing of safety factor values at selected depths:

TABLE 1

| MD, ft | Axial force, lbf | Vector-ratio SF | Traditional SF |
|---|---|---|---|
| 0.1 | 249763 | 1.631 | 1.884 |
| 1000 | 217766 | 1.688 | 1.920 |
| 5000 | 89766 | 1.923 | 2.048 |

TABLE 1-continued

| MD, ft | Axial force, lbf | Vector-ratio SF | Traditional SF |
|---|---|---|---|
| 10000 | −70234 | 2.156 | 2.156 |
| 15000 | −230234 | 2.156 | 2.156 |

As shown in Table 1 above, the values of the vector-ratio safety factor determined for production casing 410 within wellbore 400 tend to be much smaller than the corresponding values of the traditional safety factor at depths where the tensile axial force is high. Therefore, the vector-ratio safety factor may be more representative of the relatively smaller margin of safety that is expected at points along a tubular component of the wellbore where the effective axial failure loads are relatively high. Accordingly, a design of the tubular component (e.g., production casing 410) based on a vector-ratio safety factor may be better suited to handle such higher load conditions during actual downhole operations relative to a tubular component design based on a traditional safety factor.

FIGS. 7-9 will be described in the context of a deviated wellbore for performing offshore hydrocarbon production operations.

FIG. 7 is a schematic of an illustrative configuration for a wellbore 700. As shown in FIG. 7, the various tubular components disposed within wellbore 700 include conductor casing, surface casing, production casing, and production tubing. The tubular components of wellbore 700 may be configured according to the values listed in Table 2:

TABLE 2

| Name | Type | OD (in) | MD (ft) Hanger | TOC | Base | Hole Size (in) | Annulus Fluid |
|---|---|---|---|---|---|---|---|
| Conductor | Casing | 18⅝ | 0.0 | 600.0 | 2000.0 | 24.000 | Mud 8.80# |
| Surface | Casing | 13⅜ | 0.0 | 1500.0 | 5400.0 | 17½ | Mud 10.00# |
| Production | Casing | 9⅝ | 0.0 | 6800.0 | 9700.0 | 12¼ | Mud 11.20# |
| Production | Liner | 7.000 | 9200.0 | 9200.0 | 13000.0 | 8½ | Mud 12.00# |
| Production | Tubing | 4.000 | 0.0 | | 12800.0 | | Mud 10.00# |

FIG. 8 is a plot graph 800 of an illustrative axial load profile for the production tubing of wellbore 700 of FIG. 7, e.g., as configured according to the values in Table 2 above. For purposes of this example, it is assumed that the axial load profile is based on load conditions during a full or partial evacuation of the production tubing. It is also assumed that the production tubing has a 4-inch diameter and is composed of steel tubing with a weight of 9.5 pounds per foot and a steel grade of N-80. Further, it is assumed that the axial profile in plot graph 800 is based on the following temperatures for the tubing at various depths within the subsurface formation: 60° F. at the surface of the formation, i.e., where the measured depth (MD) is at 0 feet (ft.); 40° F. at MD of 600 ft; and 227.2° F. at MD of 13000 ft. Interpolation based on the true vertical depth (TVD) may be used for determining the temperatures at other depths.

FIG. 9 is plot graph 900 of vector-ratio and traditional safety factors relative to depth of the production tubing within wellbore 700 of FIG. 7. In particular, plot graph 900 shows a comparison between values of the vector-ratio safety factor and values of the traditional safety factor at the same depth within wellbore 700. As shown by the safety factor values listed in Table 1 for wellbore 400 of FIG. 4 described above, plot graph 900 shows that the values of the vector-ratio safety factor determined for the production tubing within wellbore 700 in this example tend to be much smaller than the corresponding values of the traditional safety factor at depths where the tensile axial force is high.

Figure 10:
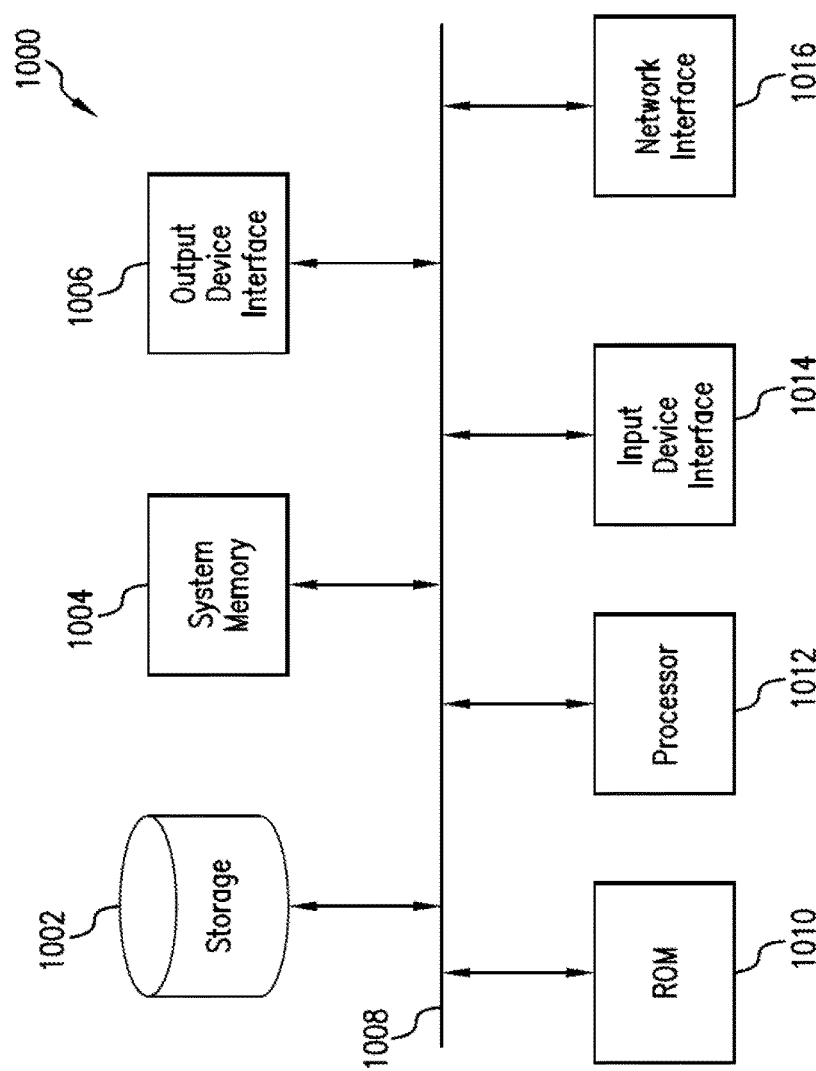
FIG. 10 is a block diagram illustrating an example of a computer system in which embodiments of the present disclosure may be implemented.

FIG. 10 is a block diagram illustrating an example of a computer system 1000 in which embodiments of the present disclosure may be implemented. For example, process 300 of FIG. 3, as described above, may be implemented using system 1000. System 1000 can be a computer, phone, PDA, or any other type of electronic device. Such an electronic device includes various types of computer readable media and interfaces for various other types of computer readable media. As shown in FIG. 10, system 1000 includes a permanent storage device 1002, a system memory 1004, an output device interface 1006, a system communications bus 1008, a read-only memory (ROM) 1010, processing unit(s) 1012, an input device interface 1014, and a network interface 1016.

Bus 1008 collectively represents all system, peripheral, and chipset buses that communicatively connect the numerous internal devices of system 1000. For instance, bus 1008 communicatively connects processing unit(s) 1012 with ROM 1010, system memory 1004, and permanent storage device 1002.

From these various memory units, processing unit(s) 1012 retrieves instructions to execute and data to process in order to execute the processes of the subject disclosure. The processing unit(s) can be a single processor or a multi-core processor in different implementations.

ROM 1010 stores static data and instructions that are needed by processing unit(s) 1012 and other modules of system 1000. Permanent storage device 1002, on the other hand, is a read-and-write memory device. This device is a non-volatile memory unit that stores instructions and data even when system 1000 is off. Some implementations of the subject disclosure use a mass-storage device (such as a magnetic or optical disk and its corresponding disk drive) as permanent storage device 1002.

Other implementations use a removable storage device (such as a floppy disk, flash drive, and its corresponding disk drive) as permanent storage device 1002. Like permanent storage device 1002, system memory 1004 is a read-and-write memory device. However, unlike storage device 1002, system memory 1004 is a volatile read-and-write memory, such a random access memory. System memory 1004 stores some of the instructions and data that the processor needs at runtime. In some implementations, the processes of the subject disclosure are stored in system memory 1004, permanent storage device 1002, and/or ROM 1010. For example, the various memory units include instructions for computer aided pipe string design based on existing string designs in accordance with some implementations. From these various memory units, processing unit(s) 1012 retrieves instructions to execute and data to process in order to execute the processes of some implementations.

Bus 1008 also connects to input and output device interfaces 1014 and 1006. Input device interface 1014 enables the user to communicate information and select commands to the system 1000. Input devices used with input device interface 1014 include, for example, alphanumeric, QWERTY, or T9 keyboards, microphones, and pointing devices (also called "cursor control devices"). Output device interfaces 1006 enables, for example, the display of images generated by the system 1000. Output devices used with output device interface 1006 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 10, bus 1008 also couples system 1000 to a public or private network (not shown) or combination of networks through a network interface 1016. Such a network may include, for example, a local area network ("LAN"), such as an Intranet, or a wide area network ("WAN"), such as the Internet. Any or all components of system 1000 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include REAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray, discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, process 300 of FIG. 3, as described above, may be implemented using system 1000 or any computer system having processing circuitry or a computer program product including instructions stored therein, which, when executed by at least one processor, causes the processor to perform functions relating to these methods.

As used in this specification and any claims of this application, the terms "computer", "server". "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

As described above, embodiments of the present disclosure are particularly useful for determining vector-ratio safety factors for wellbore tubular design. Accordingly, advantages of the present disclosure include applying vector-ratio techniques to determining load changes along a tubular component of a wellbore during hydrocarbon recovery operations to yield more realistic and conservative safety factors for wellbore tubular design.

A method of determining vector-ratio safety factors for wellbore tubular design has been described. Embodiments of such a method may include: obtaining pressure and temperature data for at least one load point along a tubular component of a wellbore; calculating an effective failure axial load expected at the load point during a downhole operation to be performed along one or more sections of the wellbore within a subsurface formation, based on the obtained pressure and temperature data; determining an upper boundary and a lower boundary for the effective failure axial load, based on physical properties of the tubular component at the load point; calculating a midpoint of the effective failure axial load based on the upper and lower boundaries; calculating a critical failure differential pressure, based on the midpoint of the effective failure axial load; and calculating a vector-ratio safety factor based on the critical failure differential pressure relative to the effective failure axial load. Also described herein is a computer-readable storage medium having instructions stored therein, which when executed by a computer cause the computer to perform a plurality of functions, including functions to: obtain pressure and temperature data for at least one load point along a tubular component of a wellbore; calculate an effective failure axial load expected at the load point during a downhole operation to be performed along one or more sections of the wellbore within a subsurface formation, based on the obtained pressure and temperature data; determine an upper boundary and a lower boundary for the effective failure axial load, based on physical properties of the tubular component at the load point; calculate a midpoint of the effective failure axial load based on the upper and lower boundaries; calculate a critical failure differential pressure, based on the midpoint of the effective failure axial load; and calculate a vector-ratio safety factor based on the critical failure differential pressure relative to the effective failure axial load.

For any of the foregoing embodiments, the method or the functions performed by the computer executing instructions stored in the computer-readable storage medium may further include any one of the following elements or functions, alone or in combination with each other: selecting one of a plurality of designs for the tubular component based on the vector-ratio safety factor; performing the downhole operation using the selected design of the tubular component along the one or more sections of the wellbore; determining whether or not the vector-ratio safety factor is within an error tolerance threshold; when the vector-ratio safety factor is determined not to be within the error tolerance threshold, adjusting at least one of the upper boundary or the lower boundary of the effective failure axial load and recalculating the midpoint of the effective failure axial load, the critical differential pressure, and the vector-ratio safety factor, based on the adjusting, wherein the adjusting and the recalculating are repeated until the vector-ratio safety factor is determined to be within the error tolerance threshold. Further, calculating the effective failure axial load may include: estimating an axial force and a differential pressure at the load point, based on the corresponding pressure and temperature data; and calculating the effective failure axial load at the load point based on the estimated axial force and the differential pressure.

For any of the foregoing embodiments of the method or computer-readable storage medium, the pressure and temperature data may be obtained from a thermal flow simulation for the load point along the tubular component of the wellbore. The tubular component of the wellbore may correspond to a portion of a tubing string or a portion of a casing string along the one or more sections of the wellbore. The critical failure differential pressure may be a critical collapse resistance along a radial load trajectory of the tubular component of the wellbore. The critical failure differential pressure may be calculated based on an industry standard formula. Alternatively, the critical failure differential pressure may be calculated based on an interpolation from a plurality of user-specified data points of failure differential pressure and the effective failure axial load at the load point along the wellbore.

Also, a system for determining vector-ratio safety factors for wellbore tubular design has been described. Embodiments of the system may include at least one processor and a memory coupled to the processor that has instructions stored therein, which when executed by the processor, cause the processor to perform functions, including functions to: obtain pressure and temperature data for at least one load point along a tubular component of a wellbore; calculate an effective failure axial load expected at the load point during a downhole operation to be performed along one or more sections of the wellbore within a subsurface formation, based on the obtained pressure and temperature data; determine an upper boundary and a lower boundary for the effective failure axial load, based on physical properties of the tubular component at the load point; calculate a midpoint of the effective failure axial load based on the upper and lower boundaries; calculate a critical failure differential pressure, based on the midpoint of the effective failure axial load; and calculate a vector-ratio safety factor based on the critical failure differential pressure relative to the effective failure axial load.

In one or more embodiments of the system, the functions performed by the processor may further include any one or a combination of the following functions to: select one of a plurality of designs for the tubular component based on the vector-ratio safety factor; perform the downhole operation using the selected design of the tubular component along the one or more sections of the wellbore; determine whether or not the vector-ratio safety factor is within an error tolerance threshold; when the vector-ratio safety factor is determined not to be within the error tolerance threshold, adjust at least one of the upper boundary or the lower boundary of the effective failure axial load and recalculate the midpoint of the effective failure axial load, the critical differential pressure, and the vector-ratio safety factor, based on the adjustment, wherein the adjustment and the recalculation are repeated until the vector-ratio safety factor is determined to be within the error tolerance threshold; estimate an axial force and a differential pressure at the load point, based on the corresponding pressure and temperature data; and calculate the effective failure axial load at the load point based on the estimated axial force and the differential pressure.

For any of the foregoing embodiments of the system, the pressure and temperature data may be obtained from a thermal flow simulation for the load point along the tubular component of the wellbore. The tubular component of the wellbore may correspond to a portion of a tubing string or a portion of a casing string along the one or more sections of the wellbore. The critical failure differential pressure may be a critical collapse resistance along a radial load trajectory of the tubular component of the wellbore. The critical failure differential pressure may be calculated based on an industry standard formula. Alternatively, the critical failure differential pressure may be calculated based on an interpolation from a plurality of user-specified data points of failure differential pressure and the effective failure axial load at the load point along the wellbore.

While specific details about the above embodiments have been described, the above hardware and software descriptions are intended merely as example embodiments and are not intended to limit the structure or implementation of the disclosed embodiments. For instance, although many other internal components of the system 1000 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification.

What is claimed is:

1. A computer-implemented method of determining vector-ratio safety factors for wellbore tubular design, the method comprising:
   obtaining pressure and temperature data for at least one load point along a tubular component of a wellbore;
   calculating an effective failure axial load expected at the load point during a downhole operation to be performed along one or more sections of the wellbore within a subsurface formation, based on the obtained pressure and temperature data;
   determining an upper boundary and a lower boundary for the effective failure axial load, based on physical properties of the tubular component at the load point;
   calculating a midpoint of the effective failure axial load based on the upper and lower boundaries;
   calculating a critical failure differential pressure corresponding to a collapse resistance of the tubular component, based on the midpoint of the effective failure axial load;
   calculating a vector-ratio safety factor for the tubular component, based on the critical failure differential pressure relative to the effective failure axial load;
   selecting one of a plurality of designs for the tubular component based on the vector-ratio safety factor; and
   performing the downhole operation using the selected design of the tubular component along the one or more sections of the wellbore.

2. The method of claim 1, further comprising:
   determining whether or not the vector-ratio safety factor is within an error tolerance threshold; and
   when the vector-ratio safety factor is determined not to be within the error tolerance threshold:
      adjusting at least one of the upper boundary or the lower boundary of the effective failure axial load; and
      recalculating the midpoint of the effective failure axial load, the critical differential pressure, and the vector-ratio safety factor, based on the adjusting,
   wherein the adjusting and the recalculating are repeated until the vector-ratio safety factor is determined to be within the error tolerance threshold.

3. The method of claim 1, wherein calculating the effective failure axial load comprises:
   estimating an axial force and a differential pressure at the load point, based on the corresponding pressure and temperature data; and
   calculating the effective failure axial load at the load point based on the estimated axial force and the differential pressure.

4. The method of claim 1, wherein the pressure and temperature data are obtained from a thermal flow simulation for the load point along the tubular component of the wellbore.

5. The method of claim 1, wherein the tubular component of the wellbore corresponds to a portion of a tubing string or a portion of a casing string along the one or more sections of the wellbore.

6. The method of claim 1, wherein the critical failure differential pressure is a critical collapse resistance along a radial load trajectory of the tubular component of the wellbore.

7. The method of claim 6, wherein the critical failure differential pressure is calculated based on an industry standard formula.

8. The method of claim 6, wherein the critical failure differential pressure is calculated based on an interpolation from a plurality of user-specified data points of failure differential pressure and the effective failure axial load at the load point along the wellbore.

9. A system for determining vector-ratio safety factors for wellbore tubular design, the system comprising:
at least one processor; and
a memory coupled to the processor having instructions stored therein, which when executed by the processor, cause the processor to perform functions including functions to:
obtain pressure and temperature data for at least one load point along a tubular component of a wellbore;
calculate an effective failure axial load expected at the load point during a downhole operation to be performed along one or more sections of the wellbore within a subsurface formation, based on the obtained pressure and temperature data;
determine an upper boundary and a lower boundary for the effective failure axial load, based on physical properties of the tubular component at the load point;
calculate a midpoint of the effective failure axial load based on the upper and lower boundaries;
calculate a critical failure differential pressure corresponding to a collapse resistance of the tubular component, based on the midpoint of the effective failure axial load;
calculate a vector-ratio safety factor for the tubular component, based on the critical failure differential pressure relative to the effective failure axial load;
select one of a plurality of designs for the tubular component based on the vector-ratio safety factor; and
perform the downhole operation using the selected design of the tubular component along the one or more sections of the wellbore.

10. The system of claim 9, wherein the functions performed by the processor further include functions to:
determine whether or not the vector-ratio safety factor is within an error tolerance threshold; and
when the vector-ratio safety factor is determined not to be within the error tolerance threshold:
adjust at least one of the upper boundary or the lower boundary of the effective failure axial load; and
recalculate the midpoint of the effective failure axial load, the critical differential pressure, and the vector-ratio safety factor, based on the adjustment to at least one of the upper boundary or the lower boundary of the effective failure axial load,
wherein the adjustment and the recalculation are repeated until the vector-ratio safety factor is determined to be within the error tolerance threshold.

11. The system of claim 9, wherein the functions performed by the processor further include functions to:
estimate an axial force and a differential pressure at the load point, based on the corresponding pressure and temperature data; and
calculate the effective failure axial load at the load point based on the estimated axial force and the differential pressure.

12. The system of claim 9, wherein the pressure and temperature data are obtained from a thermal flow simulation for the load point along the tubular component of the wellbore.

13. The system of claim 9, wherein the tubular component of the wellbore corresponds to a portion of a tubing string or a portion of a casing string along the one or more sections of the wellbore.

14. The system of claim 9, wherein the critical failure differential pressure is a critical collapse resistance along a radial load trajectory of the tubular component of the wellbore.

15. The system of claim 14, wherein the critical failure differential pressure is calculated based on an industry standard formula.

16. The system of claim 14, wherein the critical failure differential pressure is calculated based on an interpolation from a plurality of user-specified data points of failure differential pressure and the effective failure axial load at the load point along the wellbore.

17. A non-transitory computer-readable storage medium having instructions stored therein, which when executed by a computer cause the computer to perform a plurality of functions, including functions to:
obtain pressure and temperature data for at least one load point along a tubular component of a wellbore;
calculate an effective failure axial load expected at the load point during a downhole operation to be performed along one or more sections of the wellbore within a subsurface formation, based on the obtained pressure and temperature data;
determine an upper boundary and a lower boundary for the effective failure axial load, based on physical properties of the tubular component at the load point;
calculate a midpoint of the effective failure axial load based on the upper and lower boundaries;
calculate a critical failure differential pressure corresponding to a collapse resistance of the tubular component, based on the midpoint of the effective failure axial load;
calculate a vector-ratio safety factor for the tubular component, based on the critical failure differential pressure relative to the effective failure axial load;
select one of a plurality of designs for the tubular component based on the vector-ratio safety factor; and
perform the downhole operation using the selected design of the tubular component along the one or more sections of the wellbore.

* * * * *

UNITED STATES PATENT AND TRADEMARK OFFICE
CERTIFICATE OF CORRECTION

PATENT NO. : 10,380,281 B2
APPLICATION NO. : 15/359397
DATED : August 13, 2019
INVENTOR(S) : Zhengchun Liu et al.

Page 1 of 1

It is certified that error appears in the above-identified patent and that said Letters Patent is hereby corrected as shown below:

In the Specification

In Column 13, Line 42: "REAM" should be --RAM--

Signed and Sealed this
Tenth Day of March, 2020

Andrei Iancu
*Director of the United States Patent and Trademark Office*